(12) United States Patent
Luo et al.

(10) Patent No.: US 10,032,881 B2
(45) Date of Patent: Jul. 24, 2018

(54) MASK, MANUFACTURING METHOD THEREOF AND EXPOSURE SYSTEM

(71) Applicants: BOE TECHNOLOGY GROUP CO., LTD., Beijing (CN); BEIJING BOE DISPLAY TECHNOLOGY CO., LTD., Beijing (CN)

(72) Inventors: Liping Luo, Beijing (CN); Huishuang Liu, Beijing (CN); Haichen Hu, Beijing (CN); Zengbiao Sun, Beijing (CN); Tao Wang, Beijing (CN); Kiyong Kim, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/504,936

(22) PCT Filed: Mar. 25, 2016

(86) PCT No.: PCT/CN2016/077321
§ 371 (c)(1),
(2) Date: Feb. 17, 2017

(87) PCT Pub. No.: WO2017/045391
PCT Pub. Date: Mar. 23, 2017

(65) Prior Publication Data
US 2017/0278940 A1    Sep. 28, 2017

(30) Foreign Application Priority Data

Sep. 16, 2015   (CN) .......................... 2015 1 0591876

(51) Int. Cl.
H01L 29/49     (2006.01)
H01L 27/12     (2006.01)
H01L 29/45     (2006.01)

(52) U.S. Cl.
CPC ........ *H01L 29/4908* (2013.01); *H01L 27/127* (2013.01); *H01L 27/1214* (2013.01); *H01L 27/1262* (2013.01); *H01L 29/458* (2013.01)

(58) Field of Classification Search
None
See application file for complete search history.

(56) References Cited

U.S. PATENT DOCUMENTS 7,479,355 B1    1/2009  Chen et al.
2004/0207791 A1*  10/2004  Lee .................. G02F 1/134363
                                                    349/141

(Continued)

FOREIGN PATENT DOCUMENTS

CN    101598894 A    12/2009
CN    104280997 A    1/2015

(Continued)

OTHER PUBLICATIONS

International Search Report and Written Opinion dated Jul. 4, 2016; PCT/CN2016/077321.

*Primary Examiner* — Khaja Ahmad
(74) *Attorney, Agent, or Firm* — Ladas & Parry LLP

(57) ABSTRACT

A mask, including a transparent substrate and mask patterns formed on a surface of the transparent substrate, wherein the mask patterns include a first area for forming film patterns in a display area and a second area for forming film patterns in a non-display area; both the first area and the second area are provided with a plurality of patterned sub-masks; a distribution density of the patterned sub-masks in the first area is less than a distribution density of the patterned sub-masks in the second area; each patterned sub-mask (Continued)

includes a first pattern for forming a source electrode of a transistor, a second pattern for forming a drain electrode of the transistor, and a slit interposed between the first pattern and the second pattern; and a width of the slit in the first area is greater than a width of the slit in the second area.

20 Claims, 1 Drawing Sheet

(56) References Cited

U.S. PATENT DOCUMENTS

| | | | | |
|---|---|---|---|---|
| 2008/0135846 | A1* | 6/2008 | Shin | H01L 27/0248 257/59 |
| 2008/0170168 | A1* | 7/2008 | Jung | G02F 1/13454 349/47 |
| 2009/0155990 | A1* | 6/2009 | Yanagidaira | H01L 21/31144 438/584 |
| 2009/0309823 | A1* | 12/2009 | Kimura | G09G 3/3233 345/92 |
| 2012/0028390 | A1* | 2/2012 | Lee | C03C 17/002 438/34 |

FOREIGN PATENT DOCUMENTS

| | | |
|---|---|---|
| CN | 105093807 A | 11/2015 |
| CN | 204925610 U | 12/2015 |

* cited by examiner

MASK, MANUFACTURING METHOD THEREOF AND EXPOSURE SYSTEM

TECHNICAL FIELD

The present invention relates to a field of display technology, in particular to a mask, a manufacturing method thereof and an exposure system.

BACKGROUND

In a thin-film transistor liquid crystal display (TFT-LCD), thin-film transistor (TFT), taken as a switching element of a digital circuit, plays a very important role.

Currently, in the manufacturing process of a TFT-LCD array substrate, single-slit mask, gray-tone mask or half-tone mask are generally adopted for implementing the source/drain metal mask (SD mask) process. When a single-slit mask is adopted for SD mask process, photoresist on channel areas between source electrodes and drain electrodes is exposed by slit diffraction. But as channels between the source electrodes and the drain electrodes are relatively narrow, if exposed light has too low light intensity after slit diffraction and is underexposed, the channels between the source electrodes and the drain electrodes of the TFT-LCD array substrate tend to have metal bridging phenomenon after subsequent development and etching; and if the exposed light has too high light intensity after slit diffraction and is overexposed, the channels between the source electrodes and the drain electrodes may also have semiconductor missing phenomenon after subsequent development and etching. No matter whether there is metal bridging phenomenon or semiconductor missing phenomenon on the channels between the source electrodes and the drain electrodes, the TFTs could not operate normally and even could not operate. Therefore, in the SD mask process by adoption of the single-slit mask, the light intensity of the exposed light which is diffracted when running through slits corresponding to the channel areas between the source electrodes and the drain electrodes must be properly controlled.

More specifically, as illustrated in FIG. 1, in the TFT-LCD array substrate, it is well-known that the distribution density of the TFTs in a non-display area 5 (e.g., a peripheral wiring area) is much higher than the distribution density of the TFTs in a display area 6 (namely a pixel area). Therefore, as for photoresist on a source/drain metal layer, taking positive photoresist as an example, in the development process after exposure, the consumption of a developer in the non-display area 5 in unit time and unit area is much lower than the consumption of the developer in the display area 6, so that the concentration of the developer in the non-display area 5 is higher than the concentration of the developer in the display area 6. Thus, the photoresist on the channel areas between the source electrodes and the drain electrodes of the TFTs in the non-display area 5 tends to be thin after development, and semiconductors on the channels between the source electrodes and the drain electrodes tend to miss after etching, so that the source electrodes and the drain electrodes cannot be communicated, and hence the TFTs in the non-display area 5 of the TFT-LCD cannot operate, and finally the display area 6 cannot display normally.

SUMMARY

The present invention provides a mask, a manufacturing method thereof and an exposure system in order to solve the technical problems in the prior art. The mask can avoid the semiconductor missing phenomenon of active areas of the transistors in the non-display area in the etching process of the source/drain metal layer, ensure that the active areas of the transistors in the non-display area cannot be disconnected after etching, and finally ensure that the transistors in the non-display area can operate normally and the display area can display normally.

The invention provides a mask, comprising a transparent substrate and mask patterns formed on a surface of the transparent substrate, wherein the mask patterns include a first area for forming film patterns in a display area and a second area for forming film patterns in a non-display area;

both the first area and the second area are provided with a plurality of patterned sub-masks; a distribution density of the patterned sub-masks in the first area is less than a distribution density of the patterned sub-masks in the second area;

each patterned sub-mask includes a first pattern for forming a source electrode of a transistor, a second pattern for forming a drain electrode of the transistor, and a slit interposed between the first pattern and the second pattern; and a width of the slit in the first area is greater than a width of the slit in the second area.

Optionally, the width of the slit in the first area is L; the width of the slit in the second area is M; and M=L−L×X %, in which 0<X<100, and X is proportional to a difference between the distribution density of the patterned sub-masks in the second area and the distribution density of the patterned sub-masks in the first area.

Optionally, both the first pattern and the second pattern are made from a light-shielding material; and a portion of the transparent substrate disposed at the bottom of the slit is exposed through the slit.

Optionally, both the first pattern and the second pattern are made from the light-shielding material with low reflectivity.

Optionally, each of the first area and the second area is further provided with a wiring pattern for forming a wiring.

Optionally, the wiring pattern is arranged in a same layer with the first pattern and the second pattern and made from a material the same with the first pattern and the second pattern.

Optionally, the first pattern and the second pattern in the mask patterns are disposed on a same surface of the transparent substrate.

The invention further provides an exposure system, comprising the mask as mentioned above.

The invention further provides a method for manufacturing a mask, comprising:

providing a transparent substrate;

depositing a light-shielding layer on a surface of the transparent substrate; and forming mask patterns on the transparent substrate by a patterning process, wherein, the mask patterns include a first area for forming film patterns in a display area and a second area for forming film patterns in a non-display area;

both the first area and the second area are provided with a plurality of patterned sub-masks; a distribution density of the patterned sub-masks in the first area is less than a distribution density of the patterned sub-masks in the second area;

each patterned sub-mask includes a first pattern for forming a source electrode of a transistor, a second pattern for forming a drain electrode of the transistor, and a slit interposed between the first pattern and the second pattern; and a width of the slit in the first area is greater than a width of the slit in the second area.

Optionally, forming the mask patterns on the transparent substrate by the patterning process specifically includes:

forming a photoresist layer on a surface of the light-shielding layer;

performing exposure and development on the photoresist layer, and forming patterned photoresist corresponding to the mask patterns; and etching the light-shielding layer by taking the patterned photoresist as a mask, and forming the mask patterns.

Optionally, performing exposure on the photoresist layer is executed by a laser exposure device.

Optionally, in the exposure of the photoresist, the patterned photoresist respectively corresponding to a slit pattern in the first area and a slit pattern in the second area are formed by controlling a exposure quantity of photoresist corresponding to the slit in the first area to be greater than a exposure quantity of photoresist corresponding to the slit in the second area.

Optionally, when the mask patterns are formed on the transparent substrate by the patterning processes, a wiring pattern is further formed in the same layer on the transparent substrate; and the wiring pattern is configured to form a wiring.

Optionally, before depositing the light-shielding layer on the transparent substrate, the method further comprises cleaning the transparent substrate; and after forming the mask patterns on the transparent substrate by the patterning process, the method further comprises checking the mask patterns formed on the transparent substrate and repairing defective mask patterns.

The advantages of the present invention:

In the mask provided by the present invention, as the width of the slits in the first area of the mask is greater than the width of the slits in the second area, the intensity of exposed light running through the slits in the second area is less than the intensity of exposed light running through the slits in the first area, so that the thickness of the photoresist (disposed on an active area layer), retained on the channel areas between the source electrodes and the drain electrodes of the transistors in the display area and the non-display area after the exposure and development of the photoresist on the source/drain metal layer of the transistors in the display area and the non-display area, is about consistent. Therefore, the present invention can avoid the semiconductor missing phenomenon of the active areas of the transistors in the non-display area in the etching process of the source/drain metal layer, ensure that the active areas of the transistors in the non-display cannot be disconnected, and finally ensure that the transistors in the non-display area can operate normally and the display area (namely the pixel area) can display normally.

The exposure system provided by the present invention improves the exposure quality by adoption of the mask and hence improves the quality of products exposed by the exposure system.

DETAILED DESCRIPTION

For more clear understanding of the technical proposals, further detailed description will be given below to the mask, the manufacturing method thereof and the exposure system, provided by the present invention, with reference to the accompanying drawings and the preferred embodiments.

First Embodiment

Figure 1:
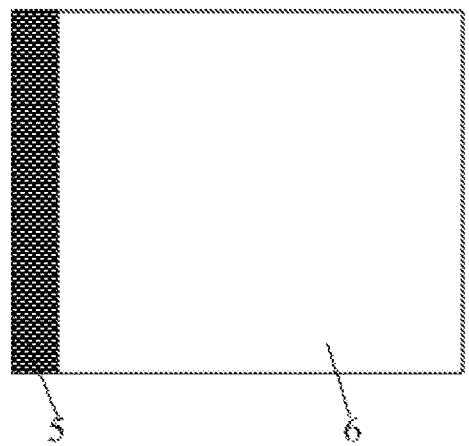
FIG. 1 is a distribution diagram of a display area and a non-display area of an array substrate in the prior art.
Figure 2:
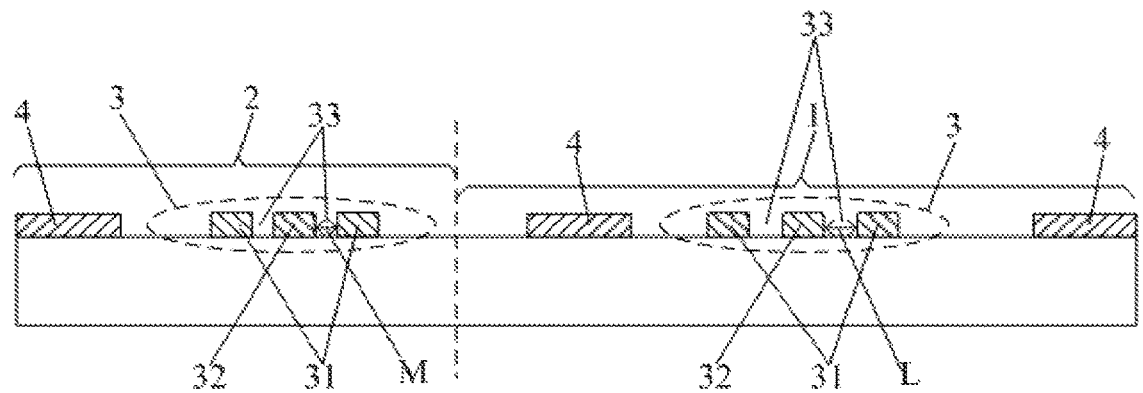
FIG. 2 is a structural sectional view of a mask in the first embodiment of the present invention.

The embodiment provides a mask, which, as illustrated in FIG. 2, comprises a transparent substrate (not marked) and mask patterns formed on a surface of the transparent substrate.

The mask pattern includes a first area 1 for forming film patterns in a display area and a second area 2 for forming film patterns in a non-display area. Obviously, the first area 1 corresponds to the film patterns in the display area, and the second area 2 corresponds to the film patterns in the non-display area.

Both the first area 1 and the second area 2 are provided with a plurality of patterned sub-masks 3. The distribution density of the patterned sub-masks 3 in the first area 1 is less than the distribution density of the patterned sub-masks 3 in the second area 2.

Each patterned sub-mask 3 includes first patterns 31 for forming a source electrode of a transistor, a second pattern 32 for forming a drain electrode of the transistor, and slits 33 interposed between the first patterns 31 and the second pattern 32. The width L of the slits 33 in the first area 1 is greater than the width M of the slits 33 in the second area 2. As the slit 33 is interposed between the first pattern 31 and the second pattern 32, the width of the slit 33 refers to the distance from the first pattern 31 to the second pattern 32.

In the embodiment, supposing that the width of the slit 33 in the first area 1 is L and the width of the slit 33 in the second area 2 is M, $M=L-L\times X$ %, in which $0<X<100$, and X is proportional to the difference between the distribution density of the patterned sub-masks 3 in the second area 2 and the first area 1. In this way, the ratio of L to M can be increased along with the increase of the difference between the distribution density of the patterned sub-masks 3 in the second area 2 and the first area 1. In the development process after exposure of photoresist on source/drain metal layers of the transistors in the display area and the non-display area, as the difference between the concentration of a developer in the non-display area and the display area is increased along with the increase of the difference between the distribution density of the transistors in the non-display area and the display area, namely the difference between the concentration of the developer in the non-display area and the display area is increased along with the increase of the difference between the distribution density of the transistors in the second area 2 and the distribution density of the transistors in the first area 1, M being less than L can correspondingly make up for the overetching of active areas of the transistors in the non-display area as the concentration of the developer in the non-display area is higher than the concentration of the developer in the display area. In other words, the width M of the slits 33 on the mask corresponding to the non-display area with higher developer concentration is small, and the width L of the slits 33 on the mask corresponding to the display area with lower developer concentration is large. Thus, in the exposure process of the photoresist on the source/drain metal layer, the light intensity of exposed light transmitted to photoresist on channel areas between source electrodes and drain electrodes of the transistors in the non-display area is low, and the light intensity of exposed light transmitted to photoresist on channel areas between source electrodes and drain electrodes of the transistors in the display area is high. Therefore, the thickness of the photoresist (disposed on an active area layer), retained on the channel areas between the source electrodes and the drain electrodes of the transistors in the display area and the non-display area after the exposure and development of the photoresist on the source/drain metal layer, is about consistent, so that it is ensured that the active areas of the transistors in the non-display area cannot be disconnected due to semiconductor missing after the etching of the source/drain metal layer.

In the embodiment, the first patterns 31 and the second patterns 32 in the mask patterns may be disposed on the same surface of the transparent substrate. Both the first patterns 31 and the second patterns 32 are made from light-shielding materials. Due to each slit 33, a portion of the transparent substrate disposed at the bottom of the slit 33 is exposed. In general, as positive photoresist is generally adopted in the exposure process of the film patterns in the display area and the non-display area, the first patterns 31 and the second patterns 32 on the mask are completely opaque patterns and the slits 33 are completely transparent, so that patterns of the source electrodes and the drain electrodes of the transistors can be formed after exposure, development and etching. In the exposure process of the photoresist on the source/drain metal layers of the transistors, the photoresist (disposed on the active area layer) on the channel areas between the source electrodes and the drain electrodes of the transistors is exposed by single-slit diffraction via the slits 33.

Preferably, both the first patterns 31 and the second patterns 32 are made from light-shielding materials with low reflectivity, e.g., chrome metal. Due to the light-shielding materials with low reflectivity, the first patterns 31 and the second patterns 32 not only can shield the exposed light but also cannot affect the normal running of the exposed light through other non-shielding areas on the mask, so that the exposure accuracy can be guaranteed.

In the embodiment, the first area 1 and the second area 2 are further provided with wiring patterns 4 for forming wirings. The wiring patterns 4 are arranged in the same layer with the first patterns 31, the second patterns 32 and the slits 33 and made from the same materials with the first patterns 31 and the second patterns 32. In the display area and the non-display area, as the source electrodes, the drain electrodes and the wirings of the transistors are generally made from the same materials and formed by one patterning process, the first area 1 and the second area 2 of the mask not only are provided with the first patterns 31 and the second patterns 32 but also may be provided with the wiring patterns 4. Thus, the wirings can be formed by one patterning process with the source electrodes and the drain electrodes of the transistors, so that the exposure efficiency can be improved. The wiring patterns 4 disposed in the first area 1 may include patterns for forming data lines in the display area, and the wiring patterns 4 in the second area 2 may include patterns for forming fallout lines in the non-display area.

It should be noted that the first area 1 and the second area 2 may also be not provided with the wiring patterns 4 for forming the wirings. That is to say, the first patterns 31, the second patterns 32 and the slits 33 may also be formed on the same mask by one patterning process, and the wiring patterns 4 are formed on another mask. In other words, the mask provided with the wiring patterns 4 and the mask provided with the first patterns 31, the second patterns 32 and the slits 33 are not the same mask.

In the embodiment, as the width of the slits 33 in the first area 1 of the mask is greater than the width of the slits 33 in the second area 2, the intensity of exposed light running through the slits 33 in the second area 2 is less than the intensity of exposed light running through the slits 33 in the first area 1. Thus, the thickness of the photoresist (disposed on the active area layer), retained on the photoresist on the channel areas between the source electrodes and the drain electrodes of the transistors in the display area and the on-display area after the exposure and development of the photoresist on the source/drain metal layers of the transistors in the display area and the non-display area, is about consistent. Therefore, the present invention can avoid the semiconductor missing phenomenon of the active areas of the transistors in the non-display area in the etching process of the source/drain metal layers, ensure that the active areas of the transistors in the non-display area cannot be disconnected, and finally ensure that the transistors in the non-display area can operate normally and the display area (namely the pixel area) can display normally.

Second Embodiment

Based on the structure of the mask provided by the first embodiment, the embodiment provides a method for manufacturing a mask. The manufacturing method comprises the following steps:

providing a transparent substrate;

depositing a light-shielding layer on a surface of the transparent substrate; and forming mask patterns on the transparent substrate by patterning processes.

The mask pattern includes a first area 1 for forming film patterns in a display area and a second area 2 for forming film patterns in a non-display area, so that the first area 1 corresponds to the film patterns in the display area and the second area 2 corresponds to the film patterns in the non-display area.

Both the first area 1 and the second area 2 are provided with a plurality of patterned sub-masks 3. The distribution density of the patterned sub-masks 3 in the first area 1 is less than the distribution density of the patterned sub-masks 3 in the second area 2. Each patterned sub-mask 3 includes first patterns 31 for forming a source electrode of a transistor, a second pattern 32 for forming a drain electrode of the transistor, and slits 33 interposed between the first pattern 31 and the second pattern 32. The width of the slits 33 in the first area 1 is greater than the width of the slits 33 in the second area 2.

In the embodiment, forming the first patterns 31, the second patterns 32 and the slits 33 by one patterning process specifically includes: firstly, coating a photoresist layer on the light-shielding layer after the deposition of the light-shielding layer on the surface of the transparent substrate, and subsequently, performing exposure on the photoresist layer by laser exposure process. More specifically, the laser exposure process may be achieved by a laser printing device. The laser printing device can emit laser rays in a certain pattern. The laser rays in a certain pattern can expose the photoresist layer after being irradiated to the photoresist layer on the light-shielding layer. Secondly, performing development on the photoresist layer, retaining photoresist corresponding to areas of first patterns 31 and areas of second patterns 32, removing photoresist in other areas, and forming patterned photoresist corresponding to the first patterns 31, the second patterns 32 and slits 33. Thirdly, etching the light-shielding layer not shielded by the photoresist layer by etching process, stripping off the photoresist layer on the first patterns 31 and the second patterns 32 after etching, and finally forming the first patterns 31, the second patterns 32 and the slits 33.

It should be noted that: in the manufacturing process of the mask, during the exposure of the photoresist layer by the laser exposure process, exposed portions of photoresist corresponding to the slits 33 in the first area 1 can be greater than exposed portions of photoresist corresponding to the slits 33 in the second area 2 by adjusting the exposure of the photoresist corresponding to the slits 33 in the first area 1 and the exposure of the photoresist corresponding to the slits 33 in the second area 2 by the laser printing device and allowing the exposure of the photoresist corresponding to the slits 33 in the first area 1 by the laser printing device to be larger than the exposure of the photoresist corresponding to the slits 33 in the second area 2. Thus, in the subsequent etching process, removed portions of the light-shielding layer corresponding to the slits 33 in the first area 1 are greater than removed portions of the light-shielding layer corresponding to the slits 33 in the second area 2, and finally, the width of the slits 33 in the first area 1 on the mask is larger than the width of the slits 33 in the second area 2.

In the embodiment, the method for manufacturing the mask may further comprise forming wiring patterns 4 on the transparent substrate. The wiring patterns 4 are configured to form wirings. Moreover, the wiring patterns 4 are arranged in the same layer with the first patterns 31, the second patterns 32 and the slits 33 in one patterning process. Thus, in the process of forming the mask patterns on the transparent substrate by the patterning processes, the light-shielding layer on the transparent substrate corresponding to the wiring patterns 4 must also be retained.

In addition, in the embodiment, before depositing the light-shielding layer on the transparent substrate, the method may also comprise the following step: cleaning the transparent substrate. After the mask patterns are formed, namely after the first patterns 31, the second patterns 32, the slits 33 and the wiring patterns 4 are formed, the method may also comprise the following step: checking the mask patterns formed on the transparent substrate and repairing defective mask patterns. The step of repairing the defective mask patterns may adopt the following methods: performing further etching on positions of the mask patterns which should be disconnected but are mutually communicated, so that the mutually communicated positions can be disconnected; and adding materials on the defective positions in the mask patterns.

In the embodiment, as the width of the slits in the first area of the mask is greater than the width of the slits in the second area, the intensity of exposed light running through the slits in the second area is less than the intensity of exposed light running through the slits in the first area, so that the thickness of photoresist (disposed on an active area layer), retained on channel areas between source electrodes and drain electrodes of transistors in the display area and the non-display area after the exposure and development of photoresist on source/drain metal layers of the transistors in the display area and the non-display area, is about consistent. Therefore, the present invention can avoid the semiconductor missing phenomenon of active areas of the transistors in the non-display area in the etching process of the source/drain metal layers, ensure that the active areas of the transistors in the non-display area cannot be disconnected, and finally ensure that the transistors in the non-display area can operate normally and the display area (namely a pixel area) can display normally.

Third Embodiment

The embodiment provides an exposure system, which comprises the mask provided by the first embodiment.

The exposure system provided by the embodiment improves the exposure quality thereof by adoption of the mask provided by the first embodiment, and hence improves the quality of products exposed by the exposure system.

It should be understood that the above embodiments are only preferred embodiments adopted for the description of the principle of the present invention but not intended to limit the present invention. Various modifications and improvements may be made by those skilled in the art without departing from the spirit and the essence of the present invention and shall also fall within the scope of protection of the present invention.

The invention claimed is:

1. A mask, comprising a transparent substrate and mask patterns formed on a surface of the transparent substrate, wherein
the mask patterns include a first area for forming film patterns in a display area and a second area for forming film patterns in a non-display area;
both the first area and the second area are provided with a plurality of patterned sub-masks; a distribution density of the patterned sub-masks in the first area is less than a distribution density of the patterned sub-masks in the second area;
each patterned sub-mask includes a first pattern for forming a source electrode of a transistor, a second pattern for forming a drain electrode of the transistor, and a slit interposed between the first pattern and the second pattern; and a width of the slit in the first area is greater than a width of the slit in the second area.

2. The mask according to claim 1, wherein the width of the slit in the first area is L; the width of the slit in the second area is M; and M=L−L×X %, in which 0<X<100, and X is proportional to a difference between the distribution density of the patterned sub-masks in the second area and the distribution density of the patterned sub-masks in the first area.

3. The mask according to claim 2, wherein both the first pattern and the second pattern are made from a light-shielding material; and a portion of the transparent substrate disposed at the bottom of the slit is exposed through the slit.

4. The mask according to claim 3, wherein both the first pattern and the second pattern are made from the light-shielding material with low reflectivity.

5. The mask according to claim 1, wherein each of the first area and the second area is further provided with a wiring pattern for forming a wiring.

6. The mask according to claim 5, wherein the wiring pattern is arranged in a same layer with the first pattern and the second pattern and made from a material the same with the first pattern and the second pattern.

7. The mask according to claim 1, wherein the first pattern and the second pattern in the mask patterns are disposed on a same surface of the transparent substrate.

8. An exposure system, comprising the mask according to claim 1.

9. A method for manufacturing a mask, comprising:
providing a transparent substrate;
depositing a light-shielding layer on a surface of the transparent substrate; and
forming mask patterns on the transparent substrate by a patterning process, wherein, the mask patterns include a first area for forming film patterns in a display area and a second area for forming film patterns in a non-display area;

both the first area and the second area are provided with a plurality of patterned sub-masks; a distribution density of the patterned sub-masks in the first area is less than a distribution density of the patterned sub-masks in the second area;

each patterned sub-mask includes a first pattern for forming a source electrode of a transistor, a second pattern for forming a drain electrode of the transistor, and a slit interposed between the first pattern and the second pattern; and a width of the slit in the first area is greater than a width of the slit in the second area.

10. The manufacturing method according to claim 9, wherein forming the mask patterns on the transparent substrate by the patterning process specifically includes:

forming a photoresist layer on a surface of the light-shielding layer;

performing exposure and development on the photoresist layer, and forming patterned photoresist corresponding to the mask patterns; and etching the light-shielding layer by taking the patterned photoresist as a mask, and forming the mask patterns.

11. The manufacturing method according to claim 10, wherein performing exposure on the photoresist layer is executed by a laser exposure device.

12. The manufacturing method according to claim 10, wherein in the exposure of the photoresist, the patterned photoresist respectively corresponding to a slit pattern in the first area and a slit pattern in the second area are formed by controlling a exposure quantity of photoresist corresponding to the slit in the first area to be greater than a exposure quantity of photoresist corresponding to the slit in the second area.

13. The manufacturing method according to claim 9, wherein when the mask patterns are formed on the transparent substrate by the patterning processes, a wiring pattern is further formed in the same layer on the transparent substrate; and the wiring pattern is configured to form a wiring.

14. The manufacturing method according to claim 9, wherein before depositing the light-shielding layer on the transparent substrate, the method further comprises cleaning the transparent substrate; and after forming the mask patterns on the transparent substrate by the patterning process, the method further comprises checking the mask patterns formed on the transparent substrate and repairing defective mask patterns.

15. The exposure system according to claim 8, wherein the width of the slit in the first area is L; the width of the slit in the second area is M; and M=L−L×X %, in which 0<X<100, and X is proportional to a difference between the distribution density of the patterned sub-masks in the second area and the distribution density of the patterned sub-masks in the first area.

16. The exposure system according to claim 15, wherein both the first pattern and the second pattern are made from a light-shielding material; and a portion of the transparent substrate disposed at the bottom of the slit is exposed through the slit.

17. The exposure system according to claim 16, wherein both the first pattern and the second pattern are made from the light-shielding material with low reflectivity.

18. The exposure system according to claim 8, wherein each of the first area and the second area is further provided with a wiring pattern for forming a wiring.

19. The exposure system according to claim 18, wherein the wiring pattern is arranged in a same layer with the first pattern and the second pattern and made from a material the same with the first pattern and the second pattern.

20. The exposure system according to claim 8, wherein the first pattern and the second pattern in the mask patterns are disposed on a same surface of the transparent substrate.

* * * * *